US008711976B2

(12) United States Patent  (10) Patent No.: US 8,711,976 B2
Chandrasekaran  (45) Date of Patent: Apr. 29, 2014

(54) PRE-DISTORTION ARCHITECTURE FOR COMPENSATING NON-LINEAR EFFECTS

(75) Inventor: Rajiv Chandrasekaran, Bridgewater, NJ (US)

(73) Assignee: Andrew LLC, Hickory, NC (US)

( * ) Notice: Subject to any disclaimer, the term of this patent is extended or adjusted under 35 U.S.C. 154(b) by 154 days.

(21) Appl. No.: 13/398,088

(22) Filed: Feb. 16, 2012

(65) Prior Publication Data

US 2012/0286865 A1  Nov. 15, 2012

Related U.S. Application Data

(60) Provisional application No. 61/485,143, filed on May 12, 2011.

(51) Int. Cl.
*H04K 1/02* (2006.01)
*H04L 25/03* (2006.01)
*H04L 25/49* (2006.01)

(52) U.S. Cl.
USPC .......................................................... 375/297

(58) Field of Classification Search
USPC .......................................................... 375/297
See application file for complete search history.

(56) References Cited

U.S. PATENT DOCUMENTS

| 4,870,371 A | 9/1989 | Gottwald et al. |
| 4,890,300 A | 12/1989 | Andrews |
| 5,132,639 A | 7/1992 | Blauvelt et al. |
| 5,187,719 A | 2/1993 | Birgenheier et al. |
| 5,361,156 A | 11/1994 | Pidgeon |
| 5,872,814 A | 2/1999 | McMeekin |
| 5,937,011 A | 8/1999 | Carney et al. |
| 6,075,411 A | 6/2000 | Briffa et al. |
| 6,081,158 A | 6/2000 | Twitchell et al. |
| 6,091,941 A | 7/2000 | Moriyama et al. |
| 6,112,062 A | 8/2000 | Hans et al. |
| 6,141,390 A | 10/2000 | Cova |

(Continued)

FOREIGN PATENT DOCUMENTS

| EP | 0 416 622 A2 | 3/1991 |
| EP | 1 085 668 A2 | 3/2001 |

(Continued)

OTHER PUBLICATIONS

"An Efficient Adaptive Predistorter for Nonlinear High Power Amplifier in Satellite Communication", by Kang H.W. et al., 1997 IEEE International Symposium on Circuits and Systems, Jun. 9-12, 1997, pp. 228-2291, XP-0000804798, New York.

(Continued)

*Primary Examiner* — Chieh M Fan
*Assistant Examiner* — Tanmay Shah
(74) *Attorney, Agent, or Firm* — Mendelsohn, Drucker & Dunleavy, P.C.; Steve Mendelsohn

(57) ABSTRACT

An input signal is pre-distorted to reduce distortion resulting from subsequent signal amplification. Frequency-dependent pre-distortion is preferably implemented in combination with frequency-independent pre-distortion, where the frequency-dependent pre-distortion is generated by expanding the derivative of a product of a pre-distortion function and the input signal and then relaxing constraints on the pre-distortion function and/or on frequency-dependent filtering associated with the frequency-dependent pre-distortion. In one implementation, four different frequency-dependent pre-distortion signals are generated for the expansion using up to four different pre-distortion functions and up to four different frequency-dependent filters.

26 Claims, 3 Drawing Sheets

(56) References Cited

U.S. PATENT DOCUMENTS

| | | | |
|---|---|---|---|
| 6,166,603 | A | 12/2000 | Smith |
| 6,194,942 | B1 | 2/2001 | Yu et al. |
| 6,236,267 | B1 | 5/2001 | Anzil |
| 6,271,724 | B1 | 8/2001 | Neffling |
| 6,275,103 | B1 | 8/2001 | Maniwa |
| 6,281,747 | B2 | 8/2001 | Ahuja et al. |
| 6,288,610 | B1 | 9/2001 | Miyashita |
| 6,288,814 | B1 | 9/2001 | Blauvelt |
| 6,304,140 | B1 | 10/2001 | Thron et al. |
| 6,342,810 | B1 | 1/2002 | Wright et al. |
| 6,366,177 | B1 | 4/2002 | McCune et al. |
| 6,373,902 | B1 | 4/2002 | Park et al. |
| 6,400,415 | B1 | 6/2002 | Danielsons |
| 6,417,731 | B1 | 7/2002 | Funada et al. |
| 6,429,736 | B1 | 8/2002 | Parry et al. |
| 6,438,186 | B1 | 8/2002 | Strait |
| 6,489,846 | B2 | 12/2002 | Hatsugai |
| 6,512,417 | B2 | 1/2003 | Booth et al. |
| 6,587,514 | B1 | 7/2003 | Wright et al. |
| 6,677,820 | B2 | 1/2004 | Miyatani |
| 6,683,495 | B2 | 1/2004 | Johnson et al. |
| 6,687,511 | B2 | 2/2004 | McGowan et al. |
| 6,700,442 | B2 | 3/2004 | Ha |
| 6,794,936 | B2 | 9/2004 | Hsu et al. |
| 6,798,843 | B1 | 9/2004 | Wright et al. |
| 6,885,709 | B1 | 4/2005 | Dartois |
| 6,903,604 | B2 | 6/2005 | Kim |
| 6,925,106 | B2 | 8/2005 | Horaguchi et al. |
| 6,975,687 | B2 | 12/2005 | Jackson et al. |
| 7,197,085 | B1 * | 3/2007 | Vella-Coleiro ............... 375/296 |
| 7,251,293 | B2 | 7/2007 | Vella-Coleiro |
| 7,535,298 | B2 | 5/2009 | Sihlbom et al. |
| 7,653,147 | B2 | 1/2010 | Palaskas et al. |
| 7,786,915 | B1 | 8/2010 | Kiper et al. |
| 7,991,076 | B2 | 8/2011 | Bode et al. |
| 8,019,015 | B2 | 9/2011 | Moffatt et al. |
| 2001/0033238 | A1 | 10/2001 | Velazquez |
| 2002/0041210 | A1 | 4/2002 | Booth et al. |
| 2002/0060606 | A1 | 5/2002 | Andre |
| 2002/0065048 | A1 | 5/2002 | Nagatani et al. |
| 2002/0080891 | A1 | 6/2002 | Ahn et al. |
| 2002/0085647 | A1 | 7/2002 | Oishi et al. |
| 2002/0125947 | A1 | 9/2002 | Ren |
| 2002/0171485 | A1 | 11/2002 | Cova |
| 2002/0186783 | A1 | 12/2002 | Opas et al. |
| 2003/0016741 | A1 | 1/2003 | Sasson et al. |
| 2003/0020538 | A1 | 1/2003 | Kim |
| 2003/0045264 | A1 | 3/2003 | Jeong et al. |
| 2003/0058959 | A1 | 3/2003 | Rafie et al. |
| 2003/0058960 | A1 | 3/2003 | Lee |
| 2003/0076894 | A1 | 4/2003 | Jin et al. |
| 2003/0076896 | A1 | 4/2003 | Ball et al. |
| 2003/0117215 | A1 | 6/2003 | O'Flaherty et al. |
| 2003/0227981 | A1 | 12/2003 | Vella-Coleiro et al. |
| 2004/0041628 | A1 | 3/2004 | Okubo et al. |
| 2004/0122627 | A1 | 6/2004 | Kybett et al. |
| 2004/0264597 | A1 | 12/2004 | Vella-Coleiro |
| 2005/0088230 | A1 | 4/2005 | Johnson et al. |
| 2008/0129379 | A1 * | 6/2008 | Copeland ...................... 330/149 |

FOREIGN PATENT DOCUMENTS

| | | |
|---|---|---|
| EP | 1 199 797 A1 | 4/2002 |
| EP | 1 280 273 A2 | 1/2003 |
| EP | 1 463 198 A2 | 9/2004 |
| GB | 2 348 755 A | 10/2000 |
| GB | 2 384 377 A | 7/2003 |
| WO | WO 03/085822 A1 | 10/2003 |

OTHER PUBLICATIONS

"A simplex method for function minimization", by J.A. Nelder and R. Mead, Computer Journal, vol. 7 (1965), pp. 308-313.

International Search Report; Mailed: Aug. 1, 2012 for corresponding PCT Application No. PCT/US2012/035742.

* cited by examiner

PRE-DISTORTION ARCHITECTURE FOR COMPENSATING NON-LINEAR EFFECTS

CROSS-REFERENCE TO RELATED APPLICATIONS

This application claims the benefit of the filing date of U.S. provisional application No. 61/485,143, filed on May 12, 2011, the teachings of which are incorporated herein by reference in their entirety.

The subject matter of this application is related to the subject matter of U.S. Pat. No. 7,251,293, the teachings of which are incorporated herein by reference in their entirety.

BACKGROUND

1. Field of the Invention

The present invention relates to signal processing and, more specifically but not exclusively, to linearizing non-linear systems, such as non-linear amplifiers, using digital pre-distortion.

2. Description of the Related Art

Introduction

This section introduces aspects that may help facilitate a better understanding of the invention. Accordingly, the statements of this section are to be read in this light and are not to be understood as admissions about what is prior art or what is not prior art.

FIG. 1 shows a schematic block diagram of signal-processing system 100, which implements a conventional linearization scheme that employs digital pre-distortion to linearize an analog sub-system 130 having a non-linear amplifier 134. Signal-processing system 100 receives a digital input signal $x[n]$ and generates a linearized, amplified, analog output signal $y_{amp}(t)$.

In particular, the digital (e.g., baseband or IF (intermediate frequency)) input signal $x[n]$ is processed by digital pre-distortion (DPD) module 114 to yield a pre-distorted digital signal $x_{pd}[n]$, which is converted into an analog pre-distorted signal $x_{pd}(t)$ using a digital-to-analog converter (DAC) 120. The output of the DAC is frequency converted to a desired frequency (e.g., RF (radio frequency)) using upconverter 132 to yield an RF analog pre-distorted signal $x_{pd\_rf}(t) = \text{Re}\{x_{pd}(t)e^{jw_c t}\}$. The RF signal $x_{pd\_rf}(t)$ is amplified by non-linear amplifier 134 to yield the output signal $y_{amp}(t)$.

Purpose of Digital Pre-Distortion

The purpose of the digital pre-distortion in signal-processing system 100 is to ensure that the output signal $y_{amp}(t)$ is close to a linear scaled version of the (theoretical) analog version $x(t)$ of the digital input signal $x[n]$. That is, $y_{amp}(t) \cong Gx(t)$, where G is a constant. Note that, in the above notation, the digital signal $x[n]$ is a sampled version of the analog signal $x(t)$.

Computation of the Digital Pre-Distortion Function

In a typical implementation, a small portion of the amplifier output signal $y_{amp}(t)$ is removed at tap 140 and mixed down to a suitable intermediate frequency (IF) (or, alternatively, to baseband) using a downconverter 150. The resulting downconverted feedback signal $y_{fb}(t)$ is digitized using an analog-to-digital (ADC) converter 160 to yield digital feedback signal $y_{fb}[n]$.

The digital pre-distortion function implemented by module 114 is initially computed and subsequently adaptively updated by comparing the input signal $x[n]$ with the feedback signal $y_{fb}[n]$ using a controller (not shown in FIG. 1) that may be implemented as part of or separate from DPD module 114. The computation can be performed in one of (at least) the following two ways:

1) In a non-real-time implementation, a block of samples of the input signal $x[n]$ and a block of samples of the feedback signal $y_{fb}[n]$ are captured and processed by the controller offline to estimate the pre-distortion function. Such estimation is typically performed in a DSP (digital signal processor) or microcontroller.

2) In a real-time implementation, the pre-distortion function is updated by the controller on a sample-by-sample basis using an adaptive non-linear filter structure.

Pre-Processing

In both cases, one or both of the signals $x[n]$ and $y_{fb}[n]$ are pre-processed before the controller estimates the pre-distortion function. The pre-processing aligns the delays, gains, and phases of the two signals. Mathematically, this can be described as follows:

Estimate the delay $\tau$ and the complex gain $\alpha$ that minimizes the cost function:

$$E\{(x[n-\tau] - \alpha y_{fb}[n])^2\},$$

where $E\{\cdot\}$ denotes the expectation value operator (or average). In the non-real-time implementation, minimizing the cost function reduces to estimating values for the delay $\tau$ and the complex gain $\alpha$ that minimize the cost function in the least-squares sense. Note that the delay $\tau$ and the complex gain $\alpha$ can be estimated successively and/or jointly. Also, note that the delay $\tau$ can be a fractional delay. Techniques for least-squares estimation are well-known. See, for example, W. H. Press, B. P. Flannery, S. A. Teukolsky, and W. T. Vetterling, *Numerical Recipes: The Art of Scientific Computing* (New York: Cambridge University Press, 1986), the teachings of which are incorporated herein by reference.

Digital Pre-Distortion Function

After the pre-processing, the digital pre-distortion can be described as estimating the arbitrary non-linear function $f_{pd}(\cdot)$ that minimizes the cost function:

$$E\{(f_{pd}(x[n-\tau], x[n-\tau-1], x[n-\tau+1], \ldots) - \alpha y_{fb}[n])^2\}. \quad (1)$$

Limitations of Prior Art

FIG. 2, which corresponds to FIG. 5 of U.S. Pat. No. 7,251,293, shows a block diagram of a digital pre-distortion architecture corresponding to the following Equation (2):

$$x_{pd}[n'] = f_0(a[n]) \cdot x[n - d_0] + (f_1(a[n]) \cdot x[n - d_0]) * h_d[n] * h_P[n], \quad (2)$$
$$+ (f_2(a[n]) \cdot x[n - d_0]) * h_d[n] * h_N[n]$$

where:

Complex input signal $x[n] = I + jQ$;

Complex pre-distorted signal $x_{pd}[n'] = I' + jQ'$ is the n'-th output sample corresponding to n-th input sample;

Input signal power $a[n] = \|x[n]\|^2 = I^2 + Q^2$ generated by power detector 502 of FIG. 2, Delay $d_0$ is a synchronization delay applied by Delay_0 block 504 of FIG. 2 to compensate for the processing delay of power detector 502;

$x[n-d_0]$ is the delayed input signal generated by Delay_0 block 504;

Delay $d_1$ is a synchronization delay applied by Delay_1 block 510 of FIG. 2 to compensate for the processing delays of filters 518, 520, 526, and 528. Note that the use of sample index n' in the output sample $x_{pd}[n']$ represents the effect of delays $d_0$ and $d_1$;

$f_0(\cdot), f_1(\cdot), f_2(\cdot)$ are (possibly non-linear) polynomial functions of the input signal power a[n] and are represented by Lookup Table #0 506, Lookup Table #1 514, and Lookup Table #2 522 of FIG. 2, respectively;

$h_d[\cdot]$ is the impulse response of each differentiator filter 518 and 526 of FIG. 2;

$h_P[\cdot], h_N[\cdot]$ are the impulse responses of positive and negative Hilbert filters 520 and 528 of FIG. 2 for selecting the positive and negative frequencies, respectively;

"·" represents the complex multiplication operator of complex multipliers 508, 516, and 524 of FIG. 2;

"*" is the convolution operator, with x[n]*h[n] representing the output of filter h corresponding to the nth input sample x[n]; and Summation block 512 of FIG. 2 represents the addition operations in Equation (2).

Pre-distortion architectures such as those shown in FIG. 2 do not provide adequate linearization for certain amplifier designs under some specific signaling conditions. An example is pre-distortion with extremely wideband signals and Doherty amplifiers.

SUMMARY

In one embodiment, the present invention is a method for reducing distortion in an output signal by applying pre-distortion to an input signal to generate a pre-distorted signal, such that, when the pre-distorted signal is applied to a non-linear system to generate the output signal, the pre-distortion reduces the distortion in the output signal. The pre-distorted signal is generated by (a) generating a first frequency-dependent pre-distortion signal corresponding to a product of (i) a derivative of a first pre-distortion function and (ii) the input signal; (b) generating a second frequency-dependent pre-distortion signal corresponding to a product of (i) a derivative of a second pre-distortion function and (ii) the input signal; (c) generating a third frequency-dependent pre-distortion signal corresponding to a product of (i) a third pre-distortion function and (ii) a derivative of the input signal; (d) generating a fourth frequency-dependent pre-distortion signal corresponding to a product of (i) a fourth pre-distortion function and (ii) a derivative of the input signal; and (e) generating the pre-distorted signal based on the first, second, third, and fourth frequency-dependent pre-distortion signals.

In another embodiment, the present invention is an apparatus for reducing distortion in an output signal by applying pre-distortion to an input signal to generate a pre-distorted signal, such that, when the pre-distorted signal is applied to a non-linear system to generate the output signal, the pre-distortion reduces the distortion in the output signal. The apparatus comprises first, second, third, and fourth signal paths and a summer. The first signal path is configured to generate a first frequency-dependent pre-distortion signal corresponding to a product of (i) a derivative of a first pre-distortion function and (ii) the input signal. The second signal path is configured to generate a second frequency-dependent pre-distortion signal corresponding to a product of (i) a derivative of a second pre-distortion function and (ii) the input signal. The third signal path is configured to generate a third frequency-dependent pre-distortion signal corresponding to a product of (i) a third pre-distortion function and (ii) a derivative of the input signal. The fourth signal path is configured to generate a fourth frequency-dependent pre-distortion signal corresponding to a product of (i) a fourth pre-distortion function and (ii) a derivative of the input signal. The summer is configured to generate the pre-distorted signal based on the first, second, third, and fourth frequency-dependent pre-distortion signals.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 2:
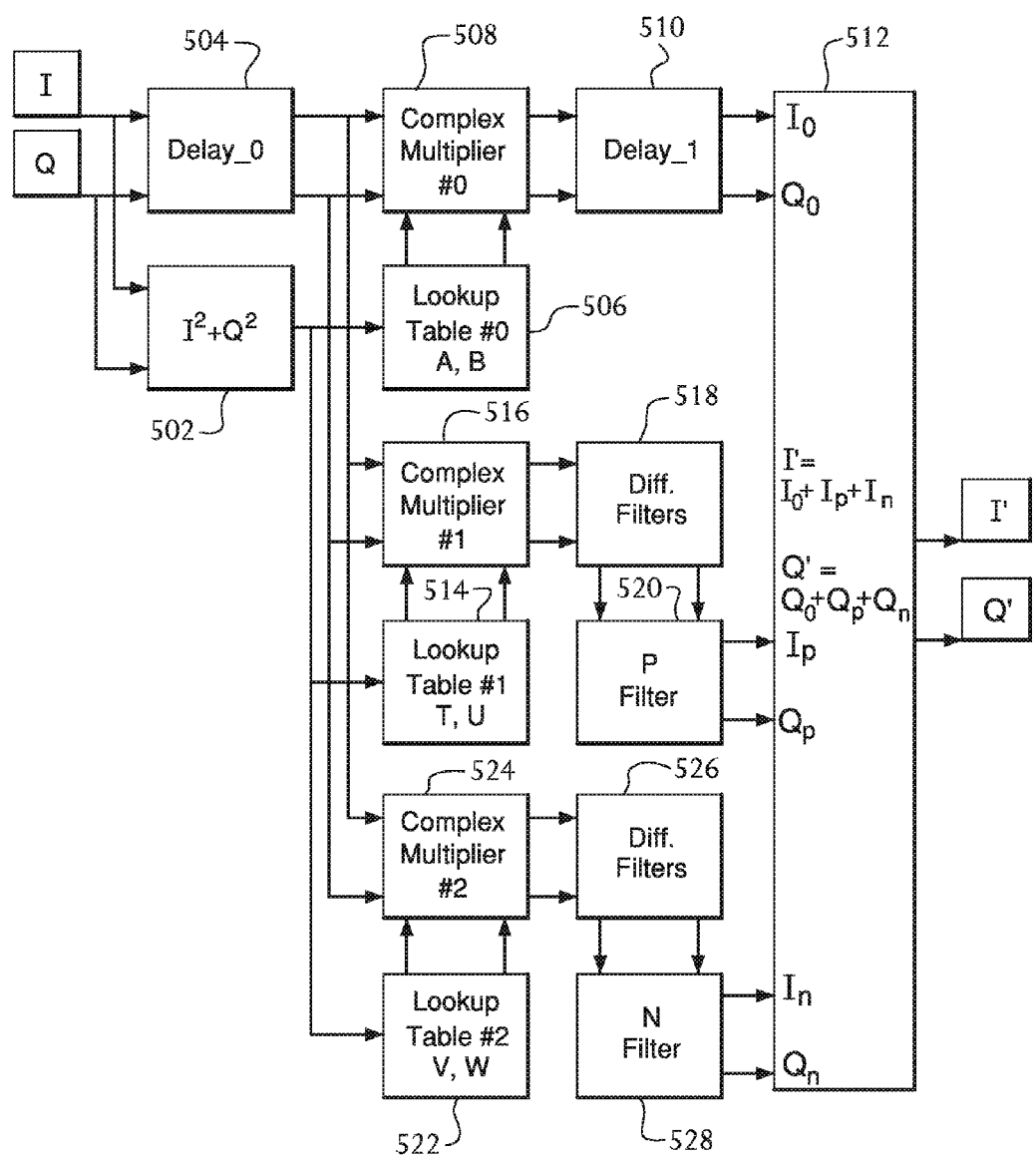
FIG. 2 shows a block diagram of a prior-art digital pre-distortion architecture.
Figure 3:
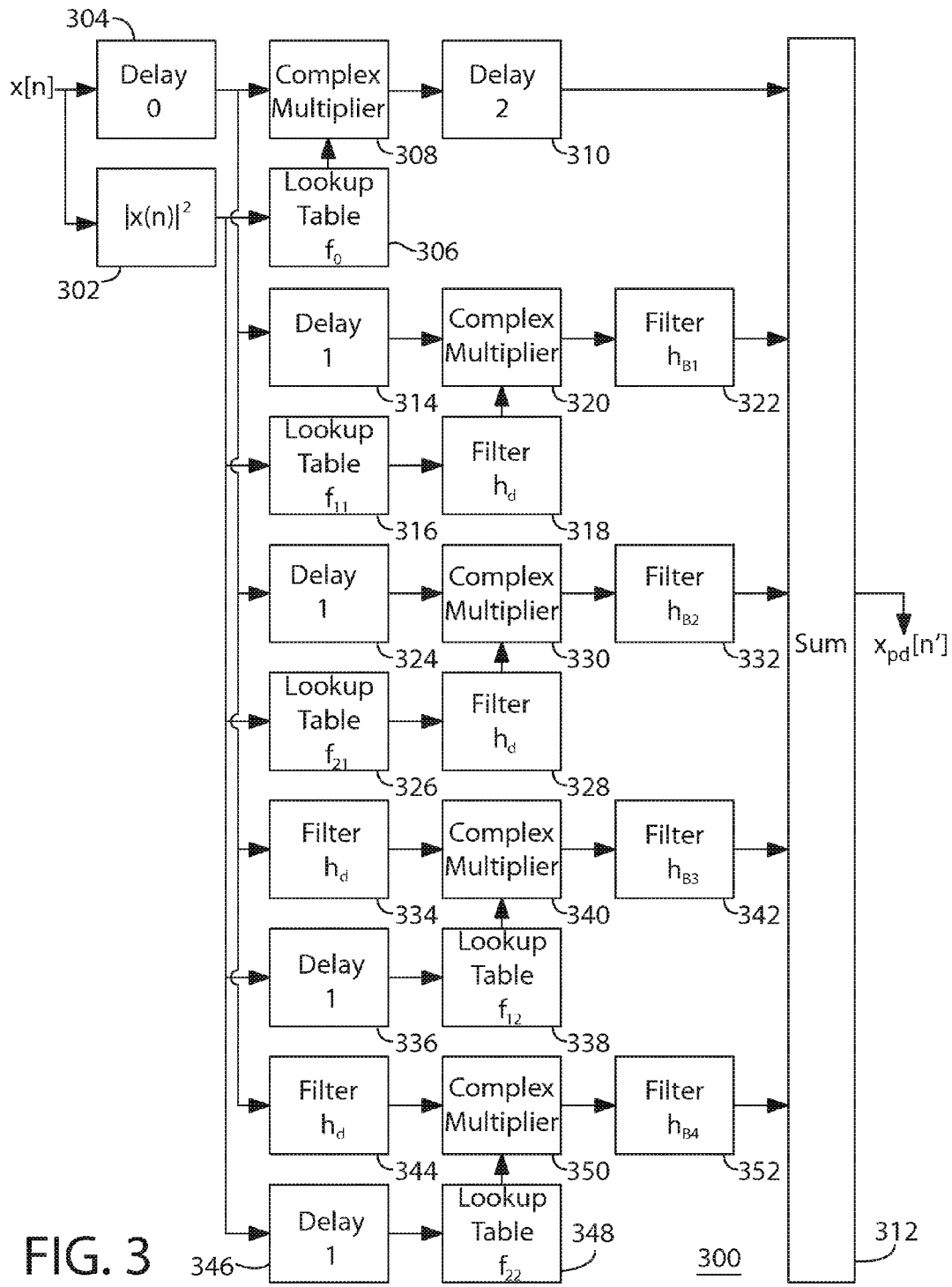
FIG. 3 shows a block diagram of a digital pre-distortion architecture according to one embodiment of the present invention.

FIG. 3 shows a block diagram of a digital pre-distortion architecture 300 according to one embodiment of the present invention. As in the digital pre-distortion architecture of FIG. 2, digital pre-distortion architecture 300 receives a complex input signal x[n] represented by in-phase (I) and quadrature-phase (Q) components and generates a complex pre-distorted signal $x_{pd}[n']$ that can be converted into an analog signal by a DAC analogous to DAC 120 of FIG. 1 for application to a non-linear analog sub-system analogous to sub-system 130 of FIG. 1. Note that, although upconverter 132 of FIG. 1 can contribute to the non-linearity of sub-system 130, since most of the non-linearity is generated by amplifier 134, for convenience, the rest of this description refers simply to the amplifier, although the teachings technically apply to the entire non-linear sub-system.

Like the architecture of FIG. 2, the digital pre-distortion architecture of FIG. 3 represents the inverse of a model of the non-linear amplifier to which the pre-distortion signals are subsequently applied. Compared to the architecture of FIG. 2, however, the digital pre-distortion architecture of FIG. 3 is based on a more-accurate model of that amplifier in order for the pre-distorter to sufficiently linearize more-complex amplifiers that exhibit significant nonlinear effects. As such, the architecture of FIG. 3 can provide better linearization for certain amplifier designs under some specific signaling conditions, such as Doherty amplifiers with extremely wideband signals (e.g., signals having a bandwidth greater than about 40 MHz).

The digital pre-distortion architecture of FIG. 3 can be represented mathematically according to Equation (3) as follows:

$$x_{pd}[n'] = f_0(a[n]) \cdot x[n-d_0] + \{x[n-d_0] \cdot (f_{11}(a[n]) * h_d[n])\} * h_{B1}[n] + \quad (3)$$
$$\{x[n-d_0] \cdot (f_{21}(a[n]) * h_d[n])\} * h_{B2}[n] +$$
$$\{f_{12}(a[n]) \cdot (x[n-d_0] * h_d[n])\} * h_{B3}[n] +$$
$$\{f_{22}(a[n]) \cdot (x[n-d_0] * h_d[n])\} * h_{B4}[n]$$

where:

Complex input signal x[n]=I+jQ;

Complex pre-distorted signal $x_{pd}[n']$=I'+jQ' is the n'-th output sample corresponding to the n-th input sample;

Input signal power $a[n]=\|x[n]\|^2=I^2+Q^2$ generated by power detector 302 of FIG. 3;

Delay $d_0$ is a synchronization delay applied by Delay 0 block 304 of FIG. 3 to compensate for the processing delay of power detector 302;

$x[n-d_0]$ is the delayed input signal generated by Delay 0 block 304;

Delay $d_1$ is a synchronization delay applied by each of Delay 1 blocks 314, 324, 336, and 346 of FIG. 3 to compensate for the processing delays of blocks 316, 326, 334, and 344;

Delay $d_2$ is a synchronization delay applied by Delay 2 block 310 of FIG. 3 to compensate for differences between the processing delays of blocks 306 and 308 and the processing delays of blocks 314-352. Note that the use of sample index n' in the output sample $x_{pd}[n']$ represents the effect of delays $d_0$, $d_1$, and $d_2$;

$f_0(\cdot)$, $f_{11}(\cdot)$, $f_{12}(\cdot)$, $f_{21}(\cdot)$, $f_{22}(\cdot)$ are (typically, but not necessarily, non-linear) polynomial pre-distortion functions of a[n] and are represented by Lookup Table $f_0$ 306, Lookup Table $f_{11}$ 316, Lookup Table $f_{21}$ 326, Lookup Table $f_{12}$ 338, and Lookup Table $f_{22}$ 348 of FIG. 3, respectively. Although shown as being implemented using lookup tables, the pre-distortion functions can alternatively be implemented algebraically;

$h_d[\cdot]$ is the impulse response of each differentiator filter 318, 328, 334, and 344 of FIG. 3;

$h_{B1}[\cdot]$, $h_{B2}[\cdot]$, $h_{B3}[\cdot]$, $h_{B4}[\cdot]$ are the impulse responses of (e.g., linear) Hilbert filters 322, 332, 342, and 352 of FIG. 3 possibly for selecting the different frequencies;

"·" represents the complex multiplication operator of complex multipliers 308, 320, 330, 340, and 350 of FIG. 3;

"*" is the convolution operator; and summation block 312 of FIG. 3 represents the addition operations in Equation (3).

The non-linear distortion generated when a signal is amplified by an amplifier can comprise both a frequency-independent portion and a frequency-dependent portion. When pre-distorting the signal prior to its being applied to such an amplifier to pre-compensate for the amplifier's non-linear distortion, the pre-distortion can also comprise both a frequency-independent portion and a frequency-dependent portion. In Equation (2), the first term on the right-hand side (RHS) represents the frequency-independent portion of the pre-distortion operation, while the second and third terms represent the frequency-dependent portion of the pre-distortion operation.

In a situation where $f_1=f_2=f$, the second and third terms would be equivalent to the time derivative of the product of two functions: the distortion function $f$ and the signal "function" x, where $h_d$ represents the derivative function, since $h_P$ and $h_N$ represent linear filters that select the positive and negative frequencies, respectively. As such, Equation (2) is equivalent to the derivative of the product of two functions $f$ and x, with the further relaxation (i.e., additional degree of freedom) that the distortion function $f$ is allowed to be two different functions: $f_1$ for positive frequencies selected by the filter function $h_P$ and $f_2$ for negative frequencies selected by the filter function $h_N$.

Based on the well-known mathematical expansion, the derivative of the product of first and second two functions is equal to (1) the product of (i) the first function and (ii) the derivative of the second function plus (2) the product of (i) the second function and (ii) the derivative of the first function.

As in Equation (2), the first term on the RHS of Equation (3) represents the frequency-independent portion of the pre-distortion operation. The second through fifth terms on the RHS of Equation (3) represent the frequency-dependent portion of the pre-distortion operation. In particular, the second and fourth terms on the RHS of Equation (3) correspond to the mathematical expansion of the second term on the RHS of Equation (2), with the further potential relaxations (corresponding to two additional degrees of freedom) that (i) the function $f_1$ of Equation (2) can be (but does not have to be) two different functions $f_{11}$ and $f_{12}$ and (ii) the positive-frequency filter function $h_P$ of Equation (2) can be (but does not have to be) two different frequency-dependent filter functions $h_{B1}$ and $h_{B3}$. Similarly, the third and fifth terms on the RHS of Equation (3) correspond to the mathematical expansion of the third term on the RHS of Equation (2), with the further potential relaxations (corresponding to two additional degrees of freedom) that (i) the function $f_2$ of Equation (2) can be (but does not have to be) two different functions $f_{21}$ and $f_{22}$ and (ii) the negative-frequency filter function $h_N$ of Equation (2) can be (but does not have to be) two different frequency-dependent filter functions $h_{B2}$ and $h_{B4}$.

Note that, when $f_{11}=f_{12}$ and $f_{21}=f_{22}$ and $h_{B1}=h_{B3}=h_P$ and $h_{B2}=h_{B4}=h_N$, then Equation (3) is equivalent to Equation (2). On the other hand, when any one or more of those four equalities is not true, including implementations in which all four equalities are not true, then Equation (3) will be different from Equation (2). Allowing one or more of those four equalities to be false allows Equation (3) to provide greater flexibility than Equation (2) in modeling the pre-distortion operation to better compensate for the amplifier's non-linear distortion, thereby providing improved pre-distortion performance.

Figure 1:
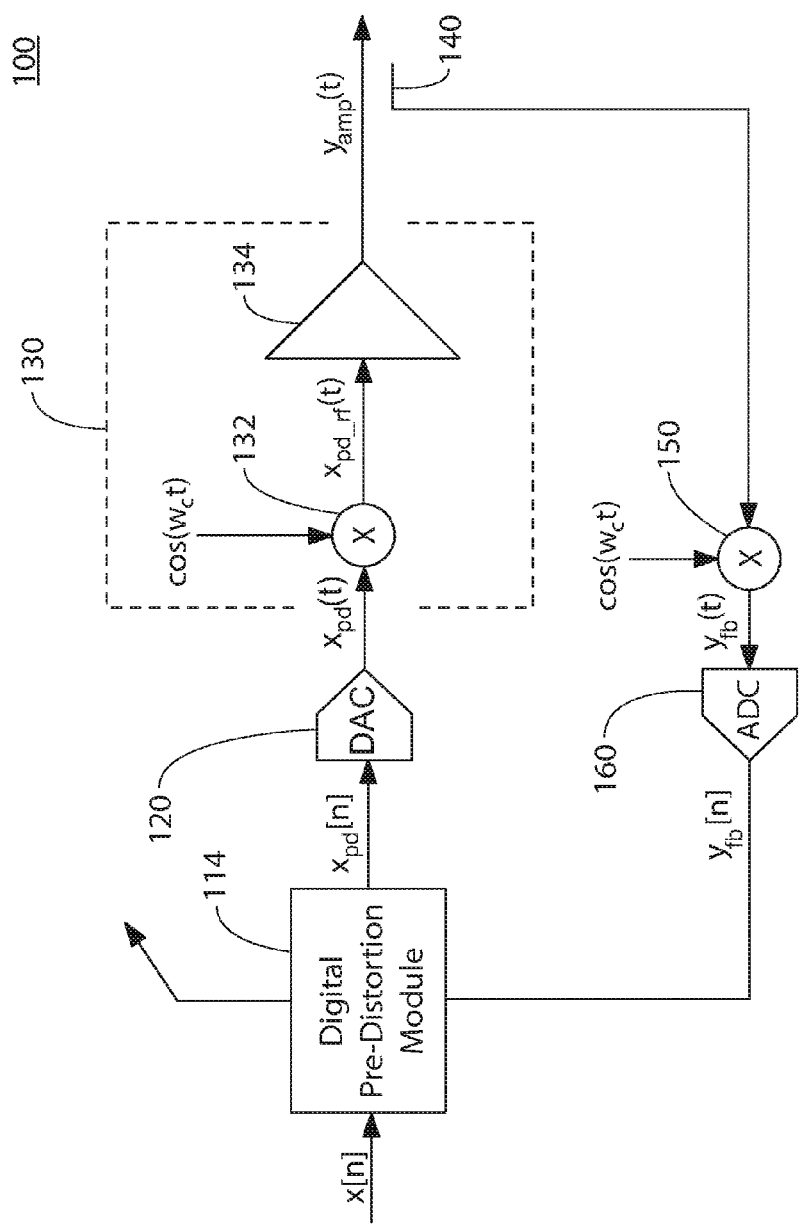
FIG. 1 shows a schematic block diagram of a signal-processing system that implements a conventional linearization scheme that employs digital pre-distortion to linearize a non-linear sub-system having a non-linear amplifier.

The (non-linear) polynomial functions $f_0(\cdot)$, $f_{11}(\cdot)$, $f_{12}(\cdot)$, $f_{21}(\cdot)$, $f_{22}(\cdot)$ and the (linear) filter functions $h_{B1}[\cdot]$, $h_{B2}[\cdot]$, $h_{B3}[\cdot]$, $h_{B4}[\cdot]$ can be generated by an algorithm which minimizes the difference between the input signal x[n] and the feedback signal $y_{fb}[n]$ (see FIG. 1). Such an algorithm could consist of an adaptive filter algorithm such as LMS as described in, for example, S. Haykin, *Adaptive Filter Theory* (Prentice Hall), or an optimization algorithm as described in, for example, W. H. Press, B. P. Flannery, S. A. Teukolsky, and W. T. Vetterling, *Numerical Recipes: The Art of Scientific Computing* (New York: Cambridge University Press, 1986).

Note that one or more of the filter functions $h_{B1}[\cdot]$, $h_{B2}[\cdot]$, $h_{B3}[\cdot]$, $h_{B4}[\cdot]$ may be delays.

Broadening

Although the present invention has been described in the context of linearizing an analog sub-system having a non-linear amplifier, the invention can also be implemented in other contexts. For example, the invention can be implemented to linearize an analog sub-system having one or more of the following elements: baseband amplification, IF (intermediate frequency) amplification, RF amplification, frequency upconversion, frequency downconversion, vector modulation. Furthermore, depending on the frequency requirements of the particular application and the frequency capabilities of the physical components used to implement the various elements, upconverter 132 and/or downconverter 150 of FIG. 1 may be omitted. Note that, in certain implementations, upconversion and/or downconversion may be partially or even completely implemented in the digital domain. In addition, pre-distorter 114 might not be adaptive, in which case the entire feedback path of tap 140, downconverter 150, and ADC 160 may be omitted.

The present invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, general-purpose computer, or other processor.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The present invention can also be embodied in the form of program code, for example, stored in a non-transitory machine-readable storage medium including being loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. A method for reducing distortion in an output signal by applying pre-distortion to an input signal to generate a pre-distorted signal, such that, when the pre-distorted signal is applied to a non-linear system to generate the output signal, the pre-distortion reduces the distortion in the output signal, wherein the pre-distorted signal is generated by:
   (a) generating a first frequency-dependent pre-distortion signal corresponding to a product of (i) a derivative of a first pre-distortion function and (ii) the input signal;
   (b) generating a second frequency-dependent pre-distortion signal corresponding to a product of (i) a derivative of a second pre-distortion function and (ii) the input signal;
   (c) generating a third frequency-dependent pre-distortion signal corresponding to a product of (i) a third pre-distortion function and (ii) a derivative of the input signal;
   (d) generating a fourth frequency-dependent pre-distortion signal corresponding to a product of (i) a fourth pre-distortion function and (ii) the derivative of the input signal; and
   (e) generating the pre-distorted signal based on a combination of the first, second, third, and fourth frequency-dependent pre-distortion signals.

2. The invention of claim 1, further comprising:
   (f) applying the pre-distorted signal to the non-linear system to generate the output signal.

3. The invention of claim 2, wherein the non-linear system comprises an amplifier that generates the output signal.

4. The invention of claim 1, wherein at least one of the first and second pre-distortion functions is different from both of the third and fourth pre-distortion functions.

5. The invention of claim 4, wherein each of the first and second pre-distortion functions is different from both of the third and fourth pre-distortion functions.

6. The invention of claim 1, wherein:
   step (a) comprises applying a first filter function to generate the first frequency-dependent pre-distortion signal;
   step (b) comprises applying a second filter function to generate the second frequency-dependent pre-distortion signal;
   step (c) comprises applying a third filter function to generate the third frequency-dependent pre-distortion signal; and
   step (d) comprises applying a fourth filter function to generate the fourth frequency-dependent pre-distortion signal.

7. The invention of claim 6, wherein the first, second, third, and fourth filter functions are frequency-dependent functions.

8. The invention of claim 6, wherein at least one of the first and second filter functions is different from both of the third and fourth filter functions.

9. The invention of claim 8, wherein each of the first and second filter functions is different from both of the third and fourth filter functions.

10. The invention of claim 1, further comprising:
(f) generating a frequency-independent pre-distortion signal corresponding to a product of (i) a fifth pre-distortion function and (ii) the input signal, wherein step (e) comprises generating the pre-distorted signal based on the first, second, third, and fourth frequency-dependent pre-distortion signals and the frequency-independent pre-distortion signal.

11. The invention of claim 1, wherein the pre-distorted signal is generated according to:

$$x_{pd}[n'] = f_0(a[n]) \cdot x[n - d_0] + \{x[n - d_0] \cdot (f_{11}(a[n]) * h_d[n])\} * h_{B1}[n] +$$
$$\{x[n - d_0] \cdot (f_{21}(a[n]) * h_d[n])\} * h_{B2}[n] +$$
$$\{f_{12}(a[n]) \cdot (x[n - d_0] * h_d[n])\} * h_{B3}[n] +$$
$$\{f_{22}(a[n]) \cdot (x[n - d_0] * h_d[n])\} * h_{B4}[n]$$

where:
x[n] is the input signal;
$x_{pd}[n']$ is the pre-distorted signal;
a[n] is the power of the input signal;
$d_0$ is a synchronization delay;
$x[n-d_0]$ is a delayed version of the input signal;
$f_{11}(\cdot), f_{12}(\cdot), f_{21}(\cdot), f_{22}(\cdot)$ are the first, second, third, and fourth pre-distortion functions;
$f_0(\cdot)$ is a fifth pre-distortion function used to generate a frequency-independent pre-distortion signal;
$h_d[\cdot]$ is a differentiating filter function;
$h_{B1}[\cdot], h_{B2}[\cdot], h_{B3}[\cdot], h_{B4}[\cdot]$ are frequency-dependent filter functions;
"·" represents complex multiplication; and
"*" represents convolution.

12. The invention of claim 11, wherein at least one of:
$f_{11}$ is different from both $f_{21}$ and $f_{22}$;
$f_{12}$ is different from both $f_{21}$ and $f_{22}$;
$h_{B1}$ is different from both $h_{B3}$ and $h_{B4}$; and
$h_{B2}$ is different from both $h_{B3}$ and $h_{B4}$.

13. The invention of claim 11, wherein:
$f_{11}$ is different from both $f_{21}$ and $f_{22}$;
$f_{12}$ is different from both $f_{21}$ and $f_{22}$;
$h_{B1}$ is different from both $h_{B3}$ and $h_{B4}$; and
$h_{B2}$ is different from both $h_{B3}$ and $h_{B4}$.

14. Apparatus for reducing distortion in an output signal by applying pre-distortion to an input signal to generate a pre-distorted signal, such that, when the pre-distorted signal is applied to a non-linear system to generate the output signal, the pre-distortion reduces the distortion in the output signal, wherein apparatus comprises:
a first signal path configured to generate a first frequency-dependent pre-distortion signal corresponding to a product of (i) a derivative of a first pre-distortion function and (ii) the input signal;
a second signal path configured to generate a second frequency-dependent pre-distortion signal corresponding to a product of (i) a derivative of a second pre-distortion function and (ii) the input signal;
a third signal path configured to generate a third frequency-dependent pre-distortion signal corresponding to a product of (i) a third pre-distortion function and (ii) a derivative of the input signal;
a fourth signal path configured to generate a fourth frequency-dependent pre-distortion signal corresponding to a product of (i) a fourth pre-distortion function and (ii) the derivative of the input signal; and
a summer configured to generate the pre-distorted signal based on the first, second, third, and fourth frequency-dependent pre-distortion signals.

15. The invention of claim 14, further comprising the non-linear system.

16. The invention of claim 15, wherein the non-linear system comprises an amplifier configured to generate the output signal.

17. The invention of claim 14, wherein:
the first, second, third, and fourth pre-distortion functions are implemented using lookup tables; and
each derivative is generated by applying a differentiating filter.

18. The invention of claim 14, wherein at least one of the first and second pre-distortion functions is different from both of the third and fourth pre-distortion functions.

19. The invention of claim 14, wherein:
the first signal path comprises a first filter configured to apply a first filter function to generate the first frequency-dependent pre-distortion signal;
the second signal path comprises a second filter configured to apply a second filter function to generate the second frequency-dependent pre-distortion signal;
the third signal path comprises a third filter configured to apply a third filter function to generate the third frequency-dependent pre-distortion signal; and
the fourth signal path comprises a fourth filter configured to apply a fourth filter function to generate the fourth frequency-dependent pre-distortion signal.

20. The invention of claim 19, wherein the first, second, third, and fourth filter functions are frequency-dependent functions.

21. The invention of claim 19, wherein at least one of the first and second filter functions is different from both of the third and fourth filter functions.

22. The invention of claim 14, further comprising:
a frequency-independent signal path configured to generate a frequency-independent pre-distortion signal corresponding to a product of (i) a frequency-independent pre-distortion function and (ii) the input signal, wherein the summer is configured to generate the pre-distorted signal based on the first, second, third, and fourth frequency-dependent pre-distortion signals and the frequency-independent pre-distortion signal.

23. The invention of claim 14, wherein the pre-distorted signal is generated according to:

$$x_{pd}[n'] = f_0(a[n]) \cdot x[n - d_0] + \{x[n - d_0] \cdot (f_{11}(a[n]) * h_d[n])\} * h_{B1}[n] +$$
$$\{x[n - d_0] \cdot (f_{21}(a[n]) * h_d[n])\} * h_{B2}[n] +$$
$$\{f_{12}(a[n]) \cdot (x[n - d_0] * h_d[n])\} * h_{B3}[n] +$$
$$\{f_{22}(a[n]) \cdot (x[n - d_0] * h_d[n])\} * h_{B4}[n]$$

where:
x[n] is the input signal;
$x_{pd}[n']$ is the pre-distorted signal;
a[n] is the power of the input signal generated by a power detector;
$d_0$ is a synchronization delay applied by a delay block;
$x[n-d_0]$ is a delayed version of the input signal;
$f_{11}(\cdot), f_{12}(\cdot), f_{21}(\cdot), f_{22}(\cdot)$ are the first, second, third, and fourth pre-distortion functions;

$f_0(\cdot)$ is a fifth pre-distortion function used in a frequency-independent signal path to generate a frequency-independent pre-distortion signal;

$h_d[\cdot]$ is a differentiating filter function;

$h_{B1}[\cdot], h_{B2}[\cdot], h_{B3}[\cdot], h_{B4}[\cdot]$ are frequency-dependent filter functions;

"·" represents complex multiplication; and

"*" represents convolution.

24. The invention of claim 23, wherein at least one of:

$f_{11}$ is different from both $f_{21}$ and $f_{22}$;

$f_{12}$ is different from both $f_{21}$ and $f_{22}$;

$h_{B1}$ is different from both $h_{B3}$ and $h_{B4}$; and $h_{B2}$ is different from both $h_{B3}$ and $h_{B4}$.

25. The invention of claim 14, wherein each derivative corresponds to differentiation with respect to time.

26. The invention of claim 1, wherein each derivative corresponds to differentiation with respect to time.

* * * * *